US008130555B2

(12) United States Patent
Hazama

(10) Patent No.: US 8,130,555 B2
(45) Date of Patent: Mar. 6, 2012

(54) NONVOLATILE SEMICONDUCTOR STORAGE DEVICE AND METHOD OF ERASE VERIFYING THE SAME

(75) Inventor: Hiroaki Hazama, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 423 days.

(21) Appl. No.: 12/493,609

(22) Filed: Jun. 29, 2009

(65) Prior Publication Data
US 2010/0008150 A1  Jan. 14, 2010

(30) Foreign Application Priority Data

Jul. 8, 2008 (JP) ................................. 2008-177871

(51) Int. Cl.
G11C 16/04 (2006.01)
(52) U.S. Cl. ............................ 365/185.29; 365/185.17
(58) Field of Classification Search ............. 365/185.29, 365/185.17, 185.27
See application file for complete search history.

(56) References Cited

U.S. PATENT DOCUMENTS

| 6,411,548 B1* | 6/2002 | Sakui et al. ............... 365/185.17 |
| 7,272,050 B2 | 9/2007 | Han et al. |
| 7,733,702 B2* | 6/2010 | Hosono ...................... 365/185.2 |

FOREIGN PATENT DOCUMENTS

JP  2006-54036  2/2006

* cited by examiner

Primary Examiner — Vu Le
(74) Attorney, Agent, or Firm — Oblon, Spivak, McClelland, Maier & Neustadt, L.L.P.

(57) ABSTRACT

A nonvolatile semiconductor storage device including a NAND cell unit having a first and a second select gate transistor, a plurality of memory cell transistors series connected between the first and second select gate transistors that are coupled to corresponding word lines, and a peripheral circuit erase verifying the NAND cell unit by turning on the first and second select gate transistors, applying a predetermined voltage level on the source line, detecting a voltage level of the bit line at once under a state where a voltage level applied on one or more of the word lines coupled to the memory cell transistors relatively closer to the second select gate transistor is arranged higher than that applied on one or more of the word lines coupled to the memory cell transistors relatively closer to the first select gate transistor, and verifying data erase based on the detected voltage.

11 Claims, 9 Drawing Sheets

| | VOLTAGE | | VOLTAGE | | VOLTAGE | | VOLTAGE |
|---|---|---|---|---|---|---|---|
| WL0 | 2.00V | WL16 | 1.50V | WL32 | 1.00V | WL48 | 0.50V |
| WL1 | 2.00V | WL17 | 1.50V | WL33 | 1.00V | WL49 | 0.50V |
| WL2 | 2.00V | WL18 | 1.50V | WL34 | 1.00V | WL50 | 0.50V |
| WL3 | 2.00V | WL19 | 1.50V | WL35 | 1.00V | WL51 | 0.50V |
| WL4 | 2.00V | WL20 | 1.50V | WL36 | 1.00V | WL52 | 0.50V |
| WL5 | 2.00V | WL21 | 1.50V | WL37 | 1.00V | WL53 | 0.50V |
| WL6 | 2.00V | WL22 | 1.50V | WL38 | 1.00V | WL54 | 0.50V |
| WL7 | 2.00V | WL23 | 1.50V | WL39 | 1.00V | WL55 | 0.50V |
| WL8 | 2.00V | WL24 | 1.50V | WL40 | 1.00V | WL56 | 0V |
| WL9 | 2.00V | WL25 | 1.50V | WL41 | 1.00V | WL57 | 0V |
| WL10 | 2.00V | WL26 | 1.50V | WL42 | 0.50V | WL58 | 0V |
| WL11 | 2.00V | WL27 | 1.50V | WL43 | 0.50V | WL59 | 0V |
| WL12 | 2.00V | WL28 | 1.50V | WL44 | 0.50V | WL60 | 0V |
| WL13 | 2.00V | WL29 | 1.50V | WL45 | 0.50V | WL61 | 0V |
| WL14 | 1.50V | WL30 | 1.00V | WL46 | 0.50V | WL62 | 0V |
| WL15 | 1.50V | WL31 | 1.00V | WL47 | 0.50V | WL63 | 0V |

|  | VOLTAGE |  | VOLTAGE |  | VOLTAGE |  | VOLTAGE |
|---|---|---|---|---|---|---|---|
| WL0 | 2.00V | WL16 | 1.50V | WL32 | 1.00V | WL48 | 0.50V |
| WL1 | 2.00V | WL17 | 1.50V | WL33 | 1.00V | WL49 | 0.25V |
| WL2 | 2.00V | WL18 | 1.50V | WL34 | 1.00V | WL50 | 0.25V |
| WL3 | 2.00V | WL19 | 1.50V | WL35 | 0.75V | WL51 | 0.25V |
| WL4 | 2.00V | WL20 | 1.50V | WL36 | 0.75V | WL52 | 0.25V |
| WL5 | 2.00V | WL21 | 1.25V | WL37 | 0.75V | WL53 | 0.25V |
| WL6 | 2.00V | WL22 | 1.25V | WL38 | 0.75V | WL54 | 0.25V |
| WL7 | 1.75V | WL23 | 1.25V | WL39 | 0.75V | WL55 | 0.25V |
| WL8 | 1.75V | WL24 | 1.25V | WL40 | 0.75V | WL56 | 0V |
| WL9 | 1.75V | WL25 | 1.25V | WL41 | 0.75V | WL57 | 0V |
| WL10 | 1.75V | WL26 | 1.25V | WL42 | 0.50V | WL58 | 0V |
| WL11 | 1.75V | WL27 | 1.25V | WL43 | 0.50V | WL59 | 0V |
| WL12 | 1.75V | WL28 | 1.00V | WL44 | 0.50V | WL60 | 0V |
| WL13 | 1.75V | WL29 | 1.00V | WL45 | 0.50V | WL61 | 0V |
| WL14 | 1.50V | WL30 | 1.00V | WL46 | 0.50V | WL62 | 0V |
| WL15 | 1.50V | WL31 | 1.00V | WL47 | 0.50V | WL63 | 0V |

NONVOLATILE SEMICONDUCTOR STORAGE DEVICE AND METHOD OF ERASE VERIFYING THE SAME

CROSS-REFERENCE TO RELATED APPLICATIONS

This application is based upon and claims the benefit of priority from the prior Japanese Patent Application No. 2008-177871, filed on, Jul. 8, 2008 the entire contents of which are incorporated herein by reference.

FIELD

The present disclosure is related to a nonvolatile semiconductor storage device including a peripheral circuit for erase verifying a plurality of electrically erasable memory cell transistors. The present disclosure also relates to a method of erase verify.

BACKGROUND

NAND flash memory, a typical nonvolatile semiconductor storage, has been conventionally configured by a matrix aligned NAND cell units. A NAND cell unit comprises a first select gate transistor electrically connected to a bit line, a second select gate transistor electrically connected to a source line, and electrically readable, writable and erasable memory cell transistors which are each connected to a corresponding word line and disposed between the first and the second select gate transistors.

Memory device configured by such NAND cell unit is subject to requirement for high-density data storage and such requirement can be met by increasing the number of memory cell transistors connected in series. NAND flash memory executes an erase verify process after an erase operation to improve data reliability as disclosed in JP 2006-54036 A. However, as the number of memory cell transistors in a NAND cell unit is increased for densification, reliability of erase verify is in turn reduced. Such trade off may be explained by the following.

Erase verification is evaluated by the voltage level detected at the bit line. In detecting the voltage level at the bit line, when constant voltage is applied on each of the word lines while a positive voltage for erase verification is applied on the source line, voltage drop occurring at source/drain of each of the memory cell transistors causes drop in potential of back bias from the source line side to the bit line side of the memory cell transistors. This results in variance in erase verify bias between the memory cell transistors, and thus, making it difficult to perform uniform verification across the memory cell transistors spanning from the source line side to the bit line side.

The above is especially true when the number of memory cell transistors connected between the first and the second select gate transistors are increased. As opposed to this, the technical concept disclosed in JP 2006-54036 A carries out a first and second erase verify operations where the first erase verify operation is carried out under the first bias and the second erase verify operation is carried out under the second bias which differs from the first bias. Such configuration, however, produces poor erase verify speed.

SUMMARY

According to an aspect of the present disclosure, there is provided a nonvolatile semiconductor storage device including a semiconductor substrate having a surface layer; a NAND cell unit including a first select gate transistor electrically connected to a bit line; a second select gate transistor electrically connected to a source line; a plurality of memory cell transistors series connected between the first select gate transistor and the second select gate transistor, the memory cell transistors being coupled to corresponding word lines; and a peripheral circuit that performs an erase verify operation of the NAND cell unit, after an erase voltage is applied on the NAND cell unit, by turning on the first and the second select gate transistors, applying a first predetermined voltage level on the source line, detecting a voltage level of the bit line at once under a state where a voltage level applied on one or more of the word lines coupled to the memory cell transistors situated relatively closer to the second select gate transistor is arranged higher than a voltage level applied on one or more of the word lines coupled to the memory cell transistors situated relatively closer to the first gate transistor, and verifying data erase of the memory cell transistors based on the detected voltage.

According to an aspect of the present disclosure, there is provided a method of erase verifying a nonvolatile semiconductor storage device including a NAND cell unit having a first select gate transistor electrically connected to a bit line, a second select gate transistor electrically connected to a source line, a plurality of memory cell transistors series connected between the first select gate transistor and a second select gate transistor, the memory cell transistors being coupled to corresponding word lines, the method of erase verifying the nonvolatile semiconductor storage device including simultaneously erasing data stored in the memory cell transistors; turning on the first and second select gate transistors; applying a predetermined voltage level on the source line and detecting a voltage level of the bit line at once under a state where a voltage level applied on one or more of the word lines coupled to the memory cell transistors situated relatively closer to the second select gate transistor is arranged higher than a voltage level applied on one or more of the word lines coupled to the memory cell transistors situated relatively closer to the first gate transistor; and verifying data erase of the memory cell transistors based on the detected voltage.

BRIEF DESCRIPTION OF THE DRAWINGS

Other objects, features and advantages of the present disclosure will become clear upon reviewing the following description of the exemplary embodiments of the present disclosure with reference to the accompanying drawings, in which.

FIGS. 8, FIG. 9A, and FIG. 9B indicate examples of potential being applied on word lines during erase verify.

DETAILED DESCRIPTION

One exemplary embodiment employing the present disclosure to a NAND flash memory will be described with reference to the drawings. References are made to the drawings hereinafter with identical or similar reference symbols when referring to identical or similar elements.

Figure 1A:
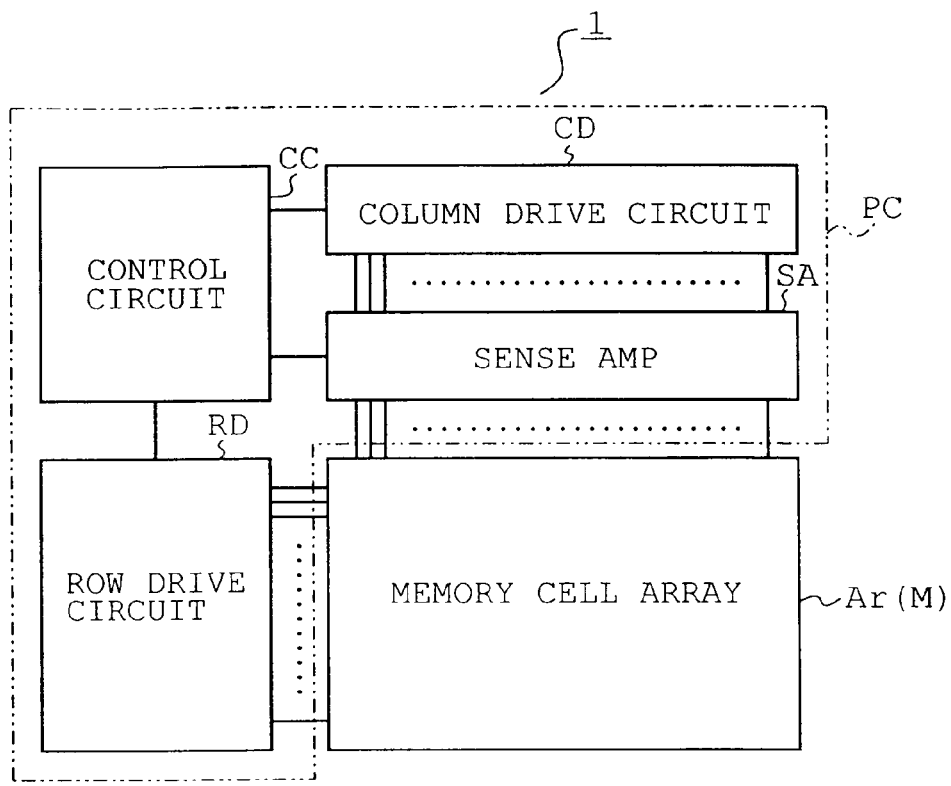
FIGS. 1A and 1B are block diagrams depicting an electrical configuration of one exemplary embodiment of the present disclosure.

FIG. 1A is a block diagram schematically describing the electrical configuration of a NAND flash memory. As can be seen in FIG. 1A, flash memory 1 includes a memory cell array Ar configured by multiplicity of matrix aligned memory cells, and a peripheral circuit PC that reads, writes, erases and erase verifies each memory cell. Memory cell array Ar is configured within a memory cell region M and peripheral circuit PC is configured in the periphery of memory cell region M.

Referring again to FIG. 1A, peripheral circuit PC is provided with a control circuit CC, a row drive circuit RD electrically connected to control circuit CC, a column drive circuit CD, and a sense amp SA (sense amplifier SA). Control circuit CC transmits a control signal to row drive circuit RD and column drive circuit CD to perform write/read/erase of each memory cell constituting memory cell array Ar.

Figure 1B:
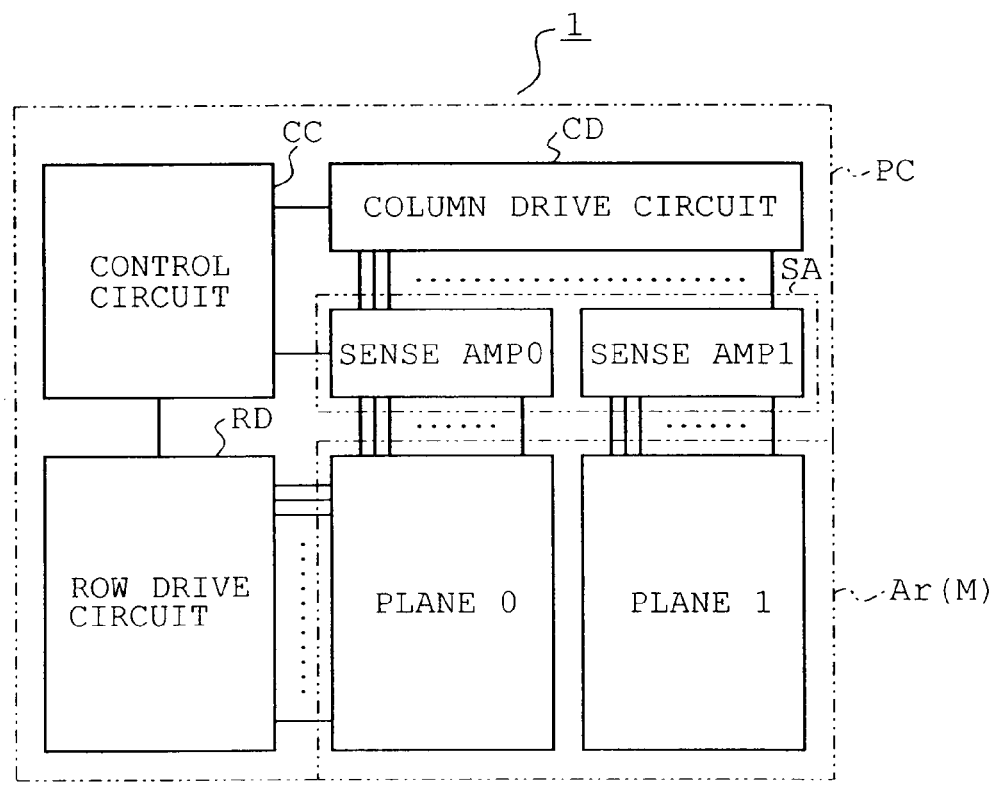

Memory cell array Ar indicated in FIG. 1A indicates a single memory cell array configuration employed in the present exemplary embodiment; however a multi-plane memory cell array configuration may be employed that is exemplified as Plane0 and Plane1 in FIG. 1B.

Figure 2:
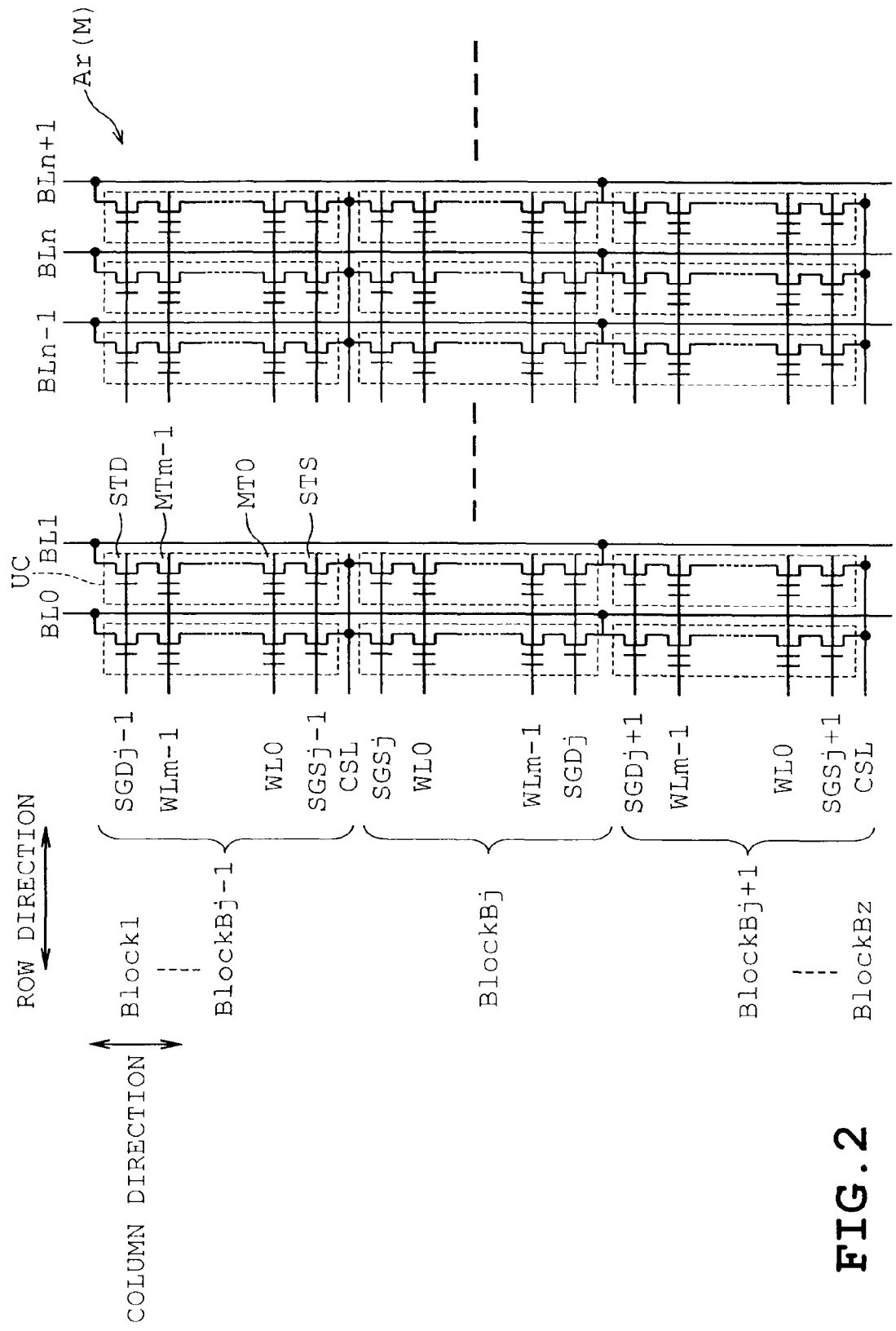
FIG. 2 depicts an electrical configuration of a memory cell array.
Figure 3:
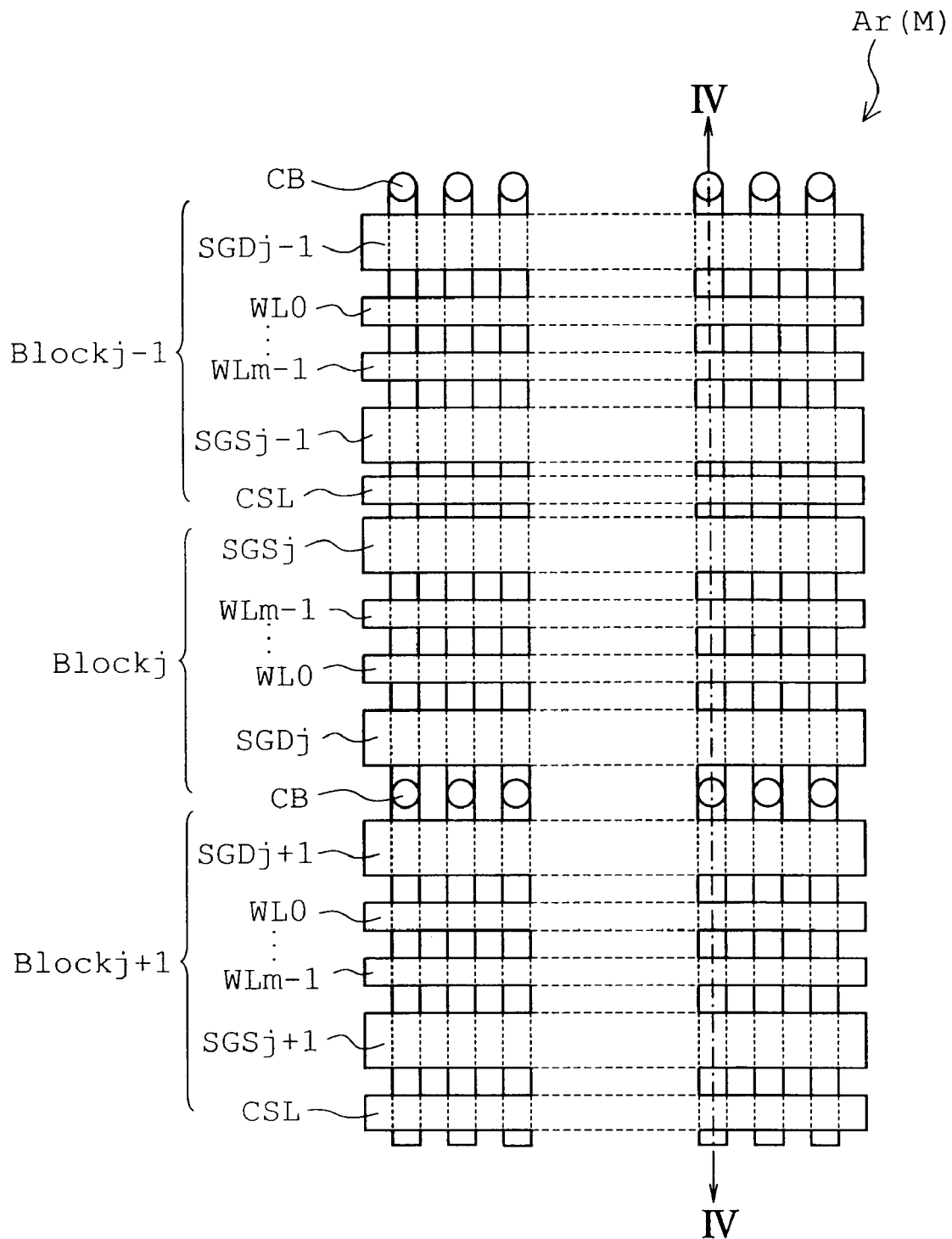
FIG. 3 is a plan view depicting a structure of the memory cell array.

FIG. 2 schematically describes the electrical configuration within memory cell array Ar and FIG. 3 is a schematic plan view of memory cell array Ar.

As can be seen in FIG. 2, memory cell array Ar within memory cell region M is configured by multiplicity of cell units UC (NAND cell units). Cell unit UC is configured by a select gate transistor STD connected to a bit line BL ($BL_0$ to $BL_{n+1}$ ...) extending in the column direction and a select gate transistor STS connected to a source line CSL, and a plurality (64, for example, or any number obtained by nth power of 2) of memory cell transistors MT ($MT_0$ to $MT_{m-1}$) series connected between the two (multiple) select gate transistors STS and STD.

Predetermined number of cell units UC aligned in the row direction constitute a single block Bj. Memory cell array Ar is configured by multiple columns (z number of columns) of cell units UC aligned in the column direction.

The gate electrodes of select gate transistors STD of cell units UC aligned in the row direction are electrically connected through select gate lines SGD. Similarly, the gate electrodes of select gate transistors STS of cell units UC aligned in the row direction are electrically connected through select gate lines SGS. Further, each of the gate electrodes of memory cell transistors MT ($MT_0$ to $MT_{m-1}$) is electrically connected to a word line WL ($WL_0$ to $WL_{m-1}$). The source of each of select gate transistors STS of cell units UC aligned in the row direction are electrically connected through source line CSL. As can be seen in FIG. 1A, sense amp SA connected to bit lines BL ($BL_0$ to $BL_{n+1}$ ...) is further connected to a latch circuit that temporarily stores read data.

Figure 4:
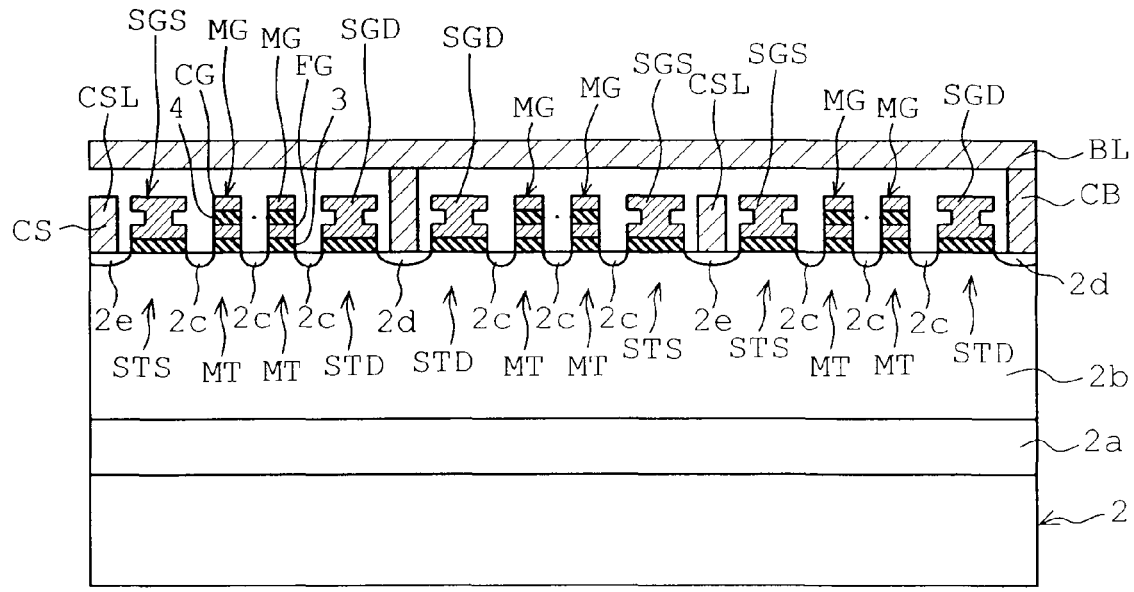
FIG. 4 is a schematic cross sectional view of a cell unit taken along line W-IV of FIG. 3.

FIG. 4 is a schematic cross sectional view of cell unit UC taken along line IV-IV of FIG. 3.

FIG. 4, depicts a p-type silicon substrate 2 having an n-well 2a formed in its surface layer and a p-well 2b formed in the surface layer of n-well 2a. P-well 2b has aforementioned select gate transistors STD and STS, and memory cell transistors MT ($MT_0$ to $MT_{m-1}$) formed in it. Such well structure allows application of high-level voltage during erase operation.

P-well 2b has select gate electrodes SGD for select gate transistors STD and select gate electrodes SGS for select gate transistors STS formed on it via gate insulating film 3. Gate electrode SGD and gate electrode SGS are isolated from the other, and between gate electrodes SGD and SGS, memory cell transistors MT ($MT_0$ to $MT_{m-1}$) are formed in a row on p-well 2b via gate insulating film 3. Memory cell gate electrode MG of each memory cell transistor MT takes a stacked-gate configuration in which an inter-gate insulating film 4 is situated between a floating gate electrode FG and a control gate electrode CG. In the surface layer of p-well 2b situated between gate electrodes MG, between gate electrode MG and gate electrode SGD, and between gate electrode MG and gate electrode SGS, an n-type impurity diffusion layer 2c constituting a source/drain of memory transistors MT is formed beside memory cell gate electrode MG. Impurity diffusion layer 2c is shared between the neighboring memory cell transistors MT. Impurity diffusion region 2c constituting the source of select gate electrode SGD is shared with the neighboring memory cell transistor MT. Impurity diffusion region 2c constituting the drain of select gate electrode SGS is shared with neighboring memory cell transistor MT.

In the surface layer of p-well 2b on the drain side of select gate electrode SGD, a heavily-doped n-type impurity diffusion region 2d is formed as a contact region on which a bit line contact CB is formed that provides connection to bit line BL ($BL_0$ to $BL_{n+1}$ ...).

On the surface layer of p-well 2b on the source side of select gate electrode SGS, a heavily-doped n-type impurity diffusion region 2e is formed as a contact region on which a source line contact CS is formed that provides connection to a source line CSL.

Description will be given hereinafter on an erase verify operation performed in the above described memory cell configuration.

Figure 5:
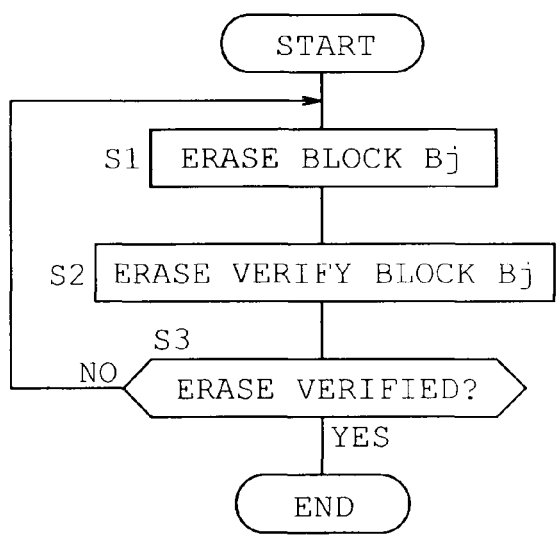
FIG. 5 is a schematic flowchart of an erase operation and an erase verify operation.

FIG. 5 is a flowchart of an erase verify operation performed by the peripheral circuit PC. As can be seen in FIG. 5, peripheral circuit PC performs erase operations in blocks. After erasing the selected erase block Bj at step S1, erase verify of block Bj is performed at step S2. If erase verify fails, process is returned to step S1 and repeats the process flow of step S1 and S2 until erase operation is successfully verified.

In the erase operation of the selected erase block Bj at step S1, peripheral circuit PC applies a high-level voltage of 20V, for example, on p-well 2b of silicon substrate 2, and a low level voltage of 0V, for example, is applied on word line WL ($WL_0$ to $WL_{m-1}$). As a result, electronic charge in memory cell gate electrode MG is released into p-well 2b, causing shift in threshold Vt from positive to negative, indicating data erase.

Figure 6:
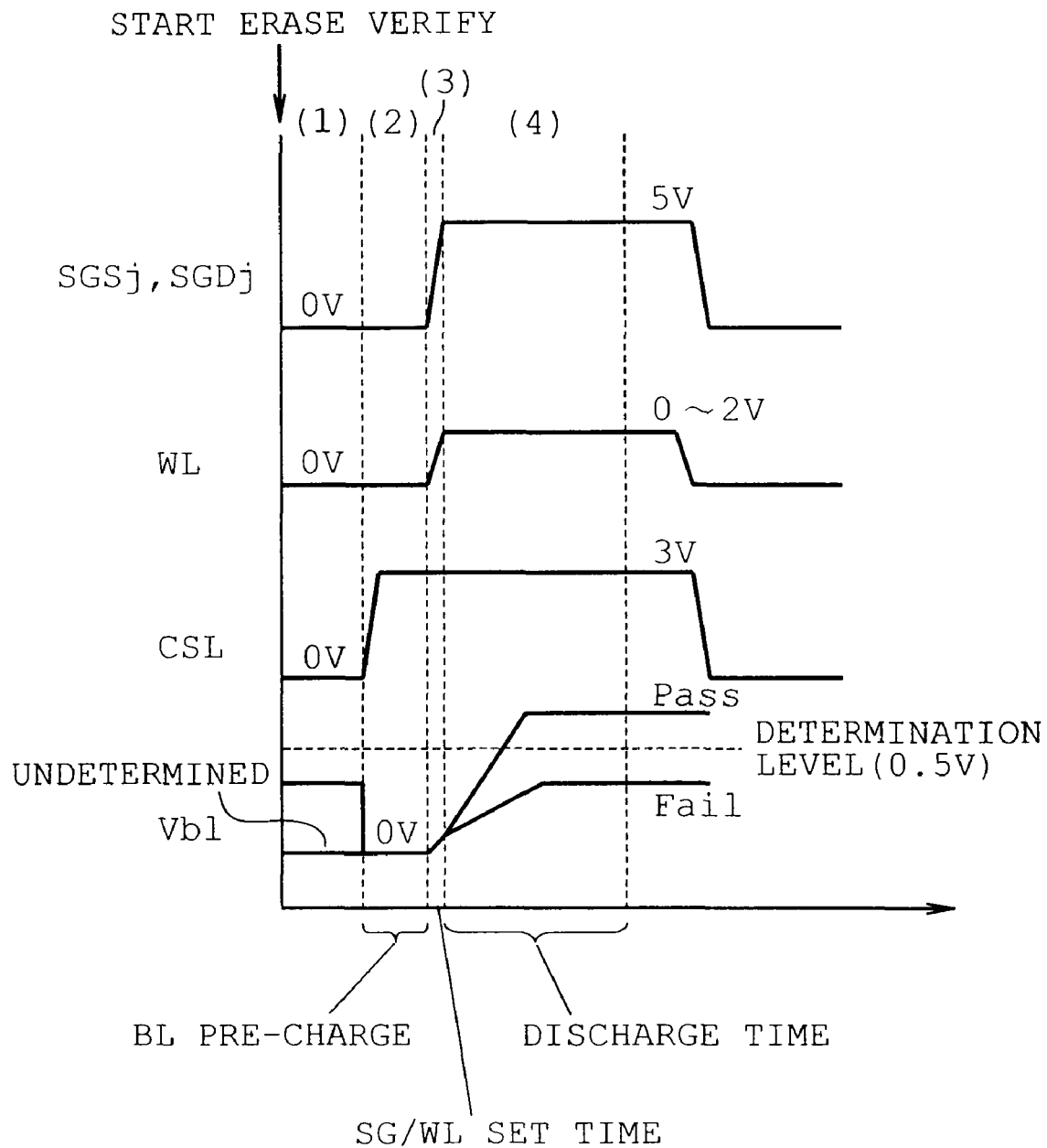
FIG. 6 is a timing chart indicating operations involved in the erase verify operation.

Timing chart given in FIG. 6 describes the timing in which potential is applied on each of the electrical elements during erase and erase verify.

As can be seen in FIG. 6, once erase verify is started, peripheral circuit PC stabilizes select gate line SGS, select gate line SDS, word line WL, and source line CSL with a low level voltage of 0V, for example, for a predetermined time period (refer to FIG. 6 (1)). After being placed in steady state, peripheral circuit PC pre-charges source line CSL with a high level voltage of 3V, for example, and potential Vbl of bit line BL with low level voltage of 0V, for example (refer to FIG. 6 (2)).

Then, peripheral circuit PC applies a voltage level of 5V, for example, which is adequate for turning on select gate transistors STS and STD, and an intermediate voltage, being intermediate in level between the voltage applied on source line (3V) and the voltage pre-charged on bit line BL, is applied on word line WL (refer to (3) and (4) of FIG. 6).

Figure 7:
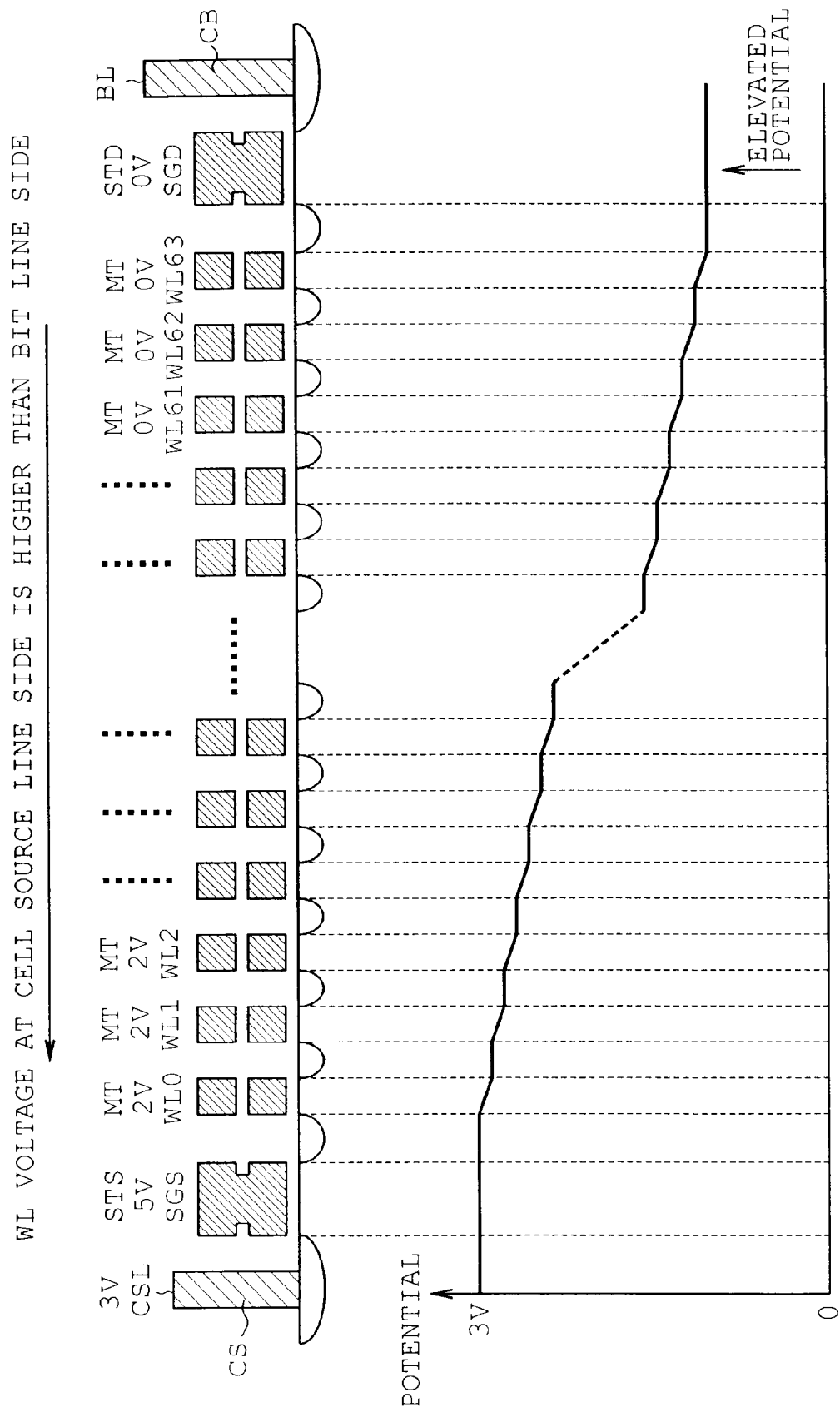
FIG. 7 schematically illustrates potential observed during erase verify.

FIG. 7 schematically indicates the potential of each transistor during erase verify. The potential indicated in FIG. 7 represent potential sufficiently placed in steady state.

Once source line CSL and bit line BL are pre-charged as described earlier, back bias occurring at each of memory cell transistors MT causes bit line BL to increase in potential. At this time, when threshold voltages Vt of all the memory cells are at a negative level of −3V or lower, for example, every single memory cell transistor MT within a given NAND cell unit UC is turned on. This causes significant amount of charge to be transferred from source line CSL side toward bit line BL side, thus, increasing potential detected at bit line BL. This increase in potential of bit line BL continues until memory cell transistor MT having the highest level of threshold voltage Vt within cell unit UC is turned off, whereafter the increase in potential subsides to a steady state.

The threshold voltage Vt, when back bias is applied on memory cell transistor MT, varies in proportion to a square of the back bias (Vbs) in case of an n-channel MOSFET. The proportional constant is determined based on parameters such as channel dope and thickness of gate oxide film 3.

As indicated in FIG. 6, peripheral circuit PC determines the success (pass)/failure (fail) of erase verify by comparing the potential of bit line BL, after a predetermined time period from erase verify voltage application, with a predetermined level of reference voltage, of 0.5V, for example. Peripheral circuit PC makes an "OK" judgment if the measured voltage is greater than the reference voltage and an "NG (No Good)" judgment if the measured voltage is equal to or less than the reference voltage (refer to (4) of FIG. 6).

Figure 8:
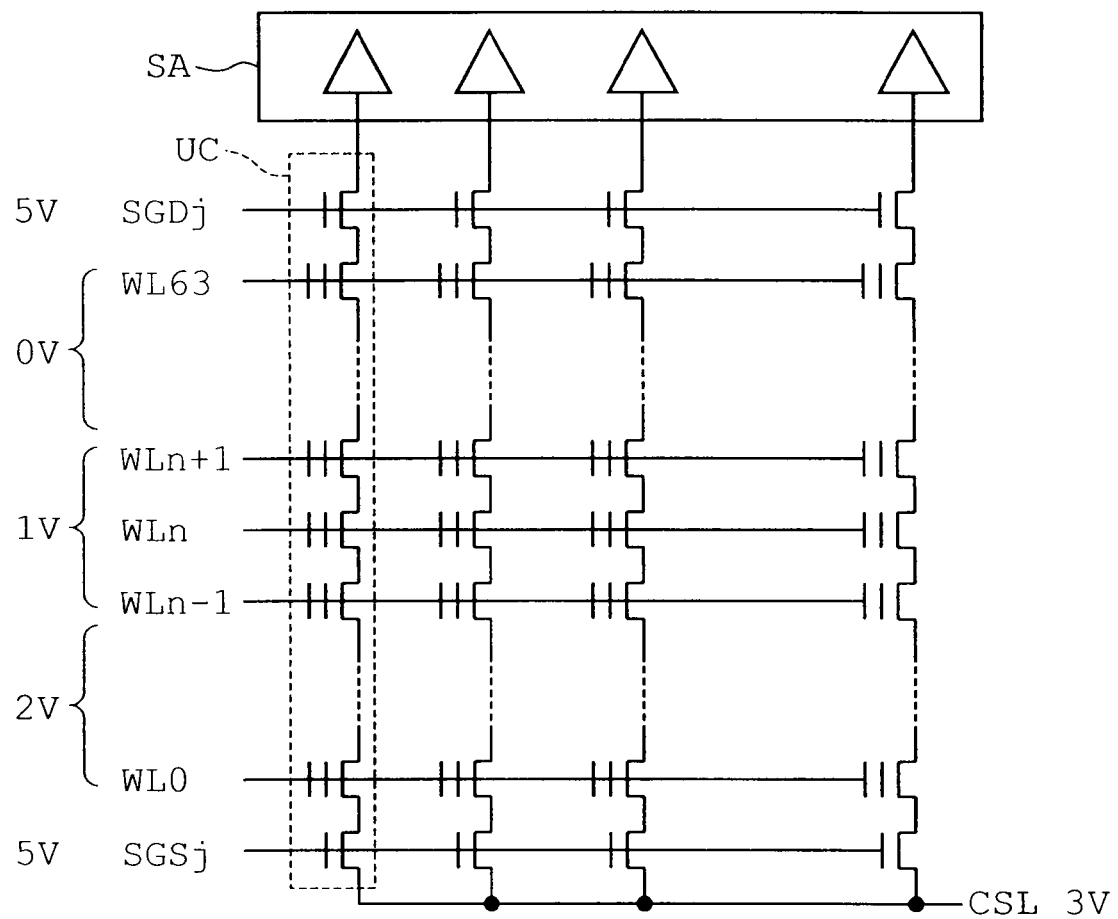

FIGS. 8, 9A, and 9B are examples of intermediary voltages that may be applied on word line WL during erase verify. As can be seen FIGS. 8 to 9B, peripheral circuit PC applies higher level of intermediary voltage on word lines $WL_0$ . . . situated relatively closer to source line CSL and having relatively lower numeric identification as compared to word lines $WL63$ . . . situated relatively closer to bit line BL and having relatively higher numeric identification.

In case the same exact level of intermediary voltage is applied on all of the word lines WL, memory cell transistors MT will be subject to different verification environment depending upon whether the relevant memory cell transistor MT is situated relatively closer to source line CSL or relatively closer to bit line BL. Such variance in verification environment, requires threshold voltage Vt of memory cell transistors MT situated relatively closer to source line CSL to be reduced in voltage level during erase as compared to that of memory cell transistors MT situated relatively closer to bit line BL in order to exceed the reference voltage level and pass the erase verify.

Another problem encountered when the same exact level of intermediary voltage is applied on all of the word lines WL is that erase verify may incorrectly pass even if threshold voltage Vt of memory cell transistors MT situated relatively closer to source line CSL is relatively higher in voltage level during erase as compared to that of memory cell transistors MT situated relatively closer to bit line BL.

Further, even with an assumption that threshold voltages Vt of memory cell transistors MT within a given cell unit UC is substantially equalized after erase, since sizable back bias is applied by memory cell transistors MT situated relatively closer to bit line BL during erase verify, threshold voltage Vt of memory cell transistors MT overall need to be reduced to an even lower voltage level in order for erase verify to pass (be judged as "OK"). This may result in a lower erase threshold voltage level than desired and lead to increase in erase time and reduce reliability in data retention in the memory cell.

To summarize, it is desirable to allow the erase verify of memory cell transistors MT within a given cell unit UC to be performed under uniform environment (conditions). More specifically, it is desirable to control the voltage level applied during erase verify such that the difference between potential applied on word line WL and the potential applied on the back gate (well 2b below memory cell gate electrode MG) of each memory cell transistor MT is uniform (constant) across the memory cell transistors MT.

Thus, voltage level applied on each word line WL during erase verify should desirably be adjusted to absorb the shift in the threshold voltage of memory cell transistors MT caused by the voltage level applied on source line CSL and the back gates of memory cell transistors MT. The voltage level to be applied on each word line WL relies on channel dope and thickness of tunnel oxide film 3, and thus, may be optimized to reflect such parameters.

In actual implementation, erase verify may be carried out in groups classified by voltage level as exemplified in FIGS. 9A or 9B such that a predetermined constant intermediary voltage is applied on a given group. The example shown in FIGS. 9A and 9B assume a 64 word line WL configuration where word lines WL are classified into 2 or more groups or equal to or less than 64. A high level voltage of 3V, for example, is decremented at stepped voltage levels such that each group varies in voltage level by a predetermined voltage step. In FIG. 9A, voltage level is gradually reduced in steps of 0.5V, whereas in FIG. 9B, voltage level is gradually reduced in steps of 0.25V.

In FIG. 9A, 64 word lines WL are classified into 5 groups comprising group G0 including WL0 to WL13, G1 including WL14 to WL27, G2 including WL28 to WL41, G3 including WL42 to WL55, and G4 including WL56 to WL63. Voltage level for erase verify is assigned to the groups such that the voltage level varies between the groups.

In FIG. 9B, word lines WL are classified into 9 groups comprising group G10 including WL0 to WL6, G11 including WL7 to WL13, G12 including WL14 to WL20, G13 including WL21 to WL27, and G14 including WL28 to WL34, G15 including WL35 to WL41, G16 including WL42 to WL48, G17 including WL49 to WL55, and G18 including WL56 to WL63. Voltage level for erase verify is assigned to the groups such that the voltage level varies between the groups. As one of ordinary skill will appreciate, the grouping is not limited to the above described examples.

It is desirable to increase the number of groups since, greater number of groups results in reduced difference in potential between each word line WL and back bias voltage level within each memory cell transistor MT, and consequently reducing the difference in potential between memory cell transistors MT. On the other hand, small number of groups is also advantageous in that it requires relatively less number of voltage generator circuitry for generating the bias to be applied on word lines WL, and thus, may be advantageous in actual implementation. The above described trade offs shall be considered in determining the number of groups.

The erase verify indicated at step S2 of FIG. 5 is performed in blocks at once for blocks B1 to Bz. Since erase verify is carried out at once, the process can be completed faster as compared with the erase verify being executed twice in the aforementioned JP 2006-54036 A.

According to the above described exemplary embodiment, peripheral circuit PC is allowed to perform uniform and accelerated erase verify of multiplicity of memory cell transistors MT since peripheral circuit PC applies high-level potential on source line CSL and arranges the voltage level to be applied at word line WL 0 of memory cell transistor MT situated relatively closer to select gate transistor STS to be greater than the voltage level applied at word line WL 63 of memory cell transistor MT situated relatively closer to select gate transistor STD. Such configuration allows the erase of multiplicity of memory cell transistors MT to be verified at once through detection of the voltage level at bit line BL.

By applying voltage on each word line WL in a voltage level capable of compensating the back bias, erase verify of memory cells can be carried out without the erase speed being dependent upon or constrained by memory cell transistors MT situated relatively closer to source line CSL as in the conventional examples.

The present disclosure is not limited to the above described exemplary embodiment but may be modified or expanded as follows.

In the above described exemplary embodiment, memory cell gate electrode MG employs floating gate electrode represented as FG as a charge storing layer. Alternatively, the so called MONOS (Metal Oxide Nitride Oxide Substrate) structure or the SONOS (Silicon Oxide Nitride Oxide Substrate) structure may be employed that configures the charge trap layer with a nitride film layer instead of floating gate electrode FG. Further, a stacked gate configuration may be employed in which a polycrystalline silicon layer is employed as a floating gate electrode FG.

A column selection switch may be provided between memory cell array Ar and sense amp SA which is shared between odd number bit lines and even number bit lines. Under such configuration, erase verify is carried out twice for a given block (either of blocks B1 to Bz) for odd number bit lines BL and even number bit lines BL. Since erase verify only needs to be performed once for a single NAND cell unit UC, erase verify can be accelerated as described in the aforementioned exemplary embodiment.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A nonvolatile semiconductor storage device, comprising:
   a semiconductor substrate having a surface layer;
   a NAND cell unit including a first select gate transistor electrically connected to a bit line; a second select gate transistor electrically connected to a source line; a plurality of memory cell transistors series connected between the first select gate transistor and the second select gate transistor, the memory cell transistors being coupled to corresponding word lines; and
   a peripheral circuit that performs an erase verify operation of the NAND cell unit, after an erase voltage is applied on the NAND cell unit, by turning on the first and the second select gate transistors, applying a first predetermined voltage level on the source line, detecting a voltage level of the bit line at once under a state where a voltage level applied on one or more of the word lines coupled to the memory cell transistors situated relatively closer to the second select gate transistor is arranged higher than a voltage level applied on one or more of the word lines coupled to the memory cell transistors situated relatively closer to the first gate transistor, and verifying data erase of the memory cell transistors based on the detected voltage.

2. The device according to claim 1, wherein the word lines coupled to the memory cell transistors are classified into a plurality of groups amounting to two or more groups equal to or less than a total count of the word lines, and wherein each of the groups include one or more of the word lines coupled to the memory cell transistors, and a constant voltage level is applied on the one or more of the word lines of each of the groups, the constant voltage level varying between the groups.

3. The device according to claim 2, wherein the constant voltage level applied on the one or more of the word lines of each of the groups is gradually reduced from one of the groups which is situated relatively closer to the second select gate transistor toward one of the groups which is situated relatively closer to the first select gate transistor.

4. The device according to claim 3, wherein the constant voltage level applied on each of the groups varies between the groups by a constant voltage step.

5. The device according to claim 1, further comprising a well formed in the surface layer of the semiconductor substrate, the NAND cell unit being configured in and on the well, each of the memory cell transistors of the NAND cell unit including a diffusion layer, wherein the peripheral circuit, during the erase verify operation, applies a second predetermined voltage level on the word lines of the memory cell transistors, the second predetermined voltage level being adjusted to absorb variance in threshold voltages of the memory cell transistors caused by voltage levels applied on the source line, the diffusion layers of the memory cell transistors, and the well.

6. The device according to claim 1, further comprising a well of a first conductive type formed in the surface layer of the semiconductor substrate, the NAND cell unit being configured in and on the well, wherein each of the memory cell transistors of the NAND cell unit includes a memory cell gate electrode formed above the well, a first diffusion layer formed in a surface layer of the well at both sides of the memory cell gate electrode and having a second conductive type being opposite in conductive type to the first conductive type, the memory cell gate electrode of the memory cell transistors within the NAND cell unit being coupled to different word lines, the first diffusion layer being shared by neighboring memory cell transistors,
   and wherein the first select gate transistor includes a first select gate electrode formed above the well, a second diffusion layer formed in the surface layer of the well at one side of the first select gate electrode, and a third diffusion layer formed in the surface layer of the well at remaining other side of the first select gate electrode, the second diffusion layer being shared with the first diffusion layer of the memory cell transistor situated at one end of the memory cell transistors connected in series, the third diffusion layer being electrically connected to the bit line,
   and wherein the second select gate transistor includes a second select gate electrode formed above the well, a fourth diffusion layer formed in the surface layer of the well at one side of the second select gate electrode, and a fifth diffusion layer formed in the surface layer of the well at remaining other side of the second select gate electrode, the fourth diffusion layer being shared with the first diffusion layer of the memory cell transistor situated at remaining other end of the memory cell transistors connected in series, the fifth diffusion layer being electrically connected to the source line, and wherein the peripheral circuit, during the erase verify operation, applies a potential on the source line to apply a positive first predetermined potential on the fifth diffusion layer of the second select gate transistor while pre-charging the bit line with a second predetermined potential lower than the first predetermined potential, and detects the voltage level of the bit line through the third diffusion layer by detecting the first predetermined potential being lowered in voltage level via the second select gate transistor, the memory cell transistors, and the first select gate transistor, wherein the voltage level applied on the word lines coupled to the memory cell transistors is adjusted to absorb variance in threshold voltages of the memory cell transistors.

7. The device according to claim 1, further comprising a well formed in the surface layer of the semiconductor substrate, the NAND cell unit being configured in and on the well, wherein each of the memory cell transistors include a memory cell gate electrode formed above the semiconductor substrate, a back gate provided in the well situated below the memory cell gate electrode, and wherein the peripheral circuit arranges the voltage level applied on the word lines coupled to the memory cell transistors such that a difference in level of potential being applied on each of the word lines coupled to the memory cell transistors and level of potential being applied on each of the back gates of the memory cell transistors is constant across the memory cell transistors.

8. A method of erase verifying a nonvolatile semiconductor storage device including a NAND cell unit having a first select gate transistor electrically connected to a bit line, a second select gate transistor electrically connected to a source line, a plurality of memory cell transistors series connected between the first select gate transistor and a second select gate transistor, the memory cell transistors being coupled to corresponding word lines, the method of erase verifying the nonvolatile semiconductor storage device, comprising:

simultaneously erasing data stored in the memory cell transistors;

turning on the first and second select gate transistors;

applying a predetermined voltage level on the source line and detecting a voltage level of the bit line at once under a state where a voltage level applied on one or more of the word lines coupled to the memory cell transistors situated relatively closer to the second select gate transistor is arranged higher than a voltage level applied on one or more of the word lines coupled to the memory cell transistors situated relatively closer to the first gate transistor; and verifying data erase of the memory cell transistors based on the detected voltage.

9. The method according to claim 8, wherein the word lines coupled to the memory cell transistors are classified into a plurality of groups amounting to two or more groups equal to or less than a total count of the word lines, and wherein each of the groups include one or more of the word lines coupled to the memory cell transistors, and a constant voltage level is applied on the one or more of the word lines of each of the groups, the constant voltage level varying between the groups.

10. The method according to claim 9, wherein the constant voltage level applied on the one or more of the word lines of each of the groups is gradually reduced from one of the groups which is situated relatively closer to the second select gate transistor toward one of the groups which is situated relatively closer to the first select gate transistor.

11. The method according to claim 10, wherein the constant voltage level applied on the groups varies between each of the groups by a constant voltage step.

* * * * *